Oct. 25, 1966 P. S. SWARTZ 3,281,737

SUPERCONDUCTIVE SOLENOID

Filed Sept. 26, 1963 2 Sheets-Sheet 1

Inventor:
Paul S. Swartz,
by Paul R. Webb, II
His Attorney.

SUPERCONDUCTIVE SOLENOID

Filed Sept. 26, 1963

Inventor:
Paul S. Swartz,
by Paul R. Webb, II
His Attorney.

United States Patent Office 3,281,737
Patented Oct. 25, 1966

3,281,737

SUPERCONDUCTIVE SOLENOID

Paul S. Swartz, Schenectady, N.Y., assignor to General Electric Company, a corporation of New York Filed Sept. 26, 1963, Ser. No. 311,676
15 Claims. (Cl. 335—216)

This application is a continuation-in-part of my copending application filed May 29, 1963, as Serial No. 284,164, and assigned to the same assignee as the present application.

This invention relates to superconductive solenoids and to methods for producing such solenoids, and more particularly to high field superconductive solenoids and to methods for producing such solenoids.

While the existence of superconductivity in many metals, metal alloys and metal compounds has been known for many years, the phenomena has been more or less treated as a scientific curiosity until comparatively recent times. The awakened interest in superconductivity may be attributed, at least in part, to technological advances in the arts where their properties would be extremely advantageous in generators, direct current motors and low frequency transformers, and to advances in cryogenics which remove many of the economic and scientific problems involved in obtaining extremely low temperature operations.

As is well known, superconduction is a term describing the type of electrical current conduction, existing in certain materials cooled below a critical temperature, $T_c$, where resistance to the flow of current is essentially non-existent. A high field superconductive solenoid includes a plurality of insulated superconductive windings containing a superconducting phase which remains superconducting in a magnetic field greater than 10,000 oersteds.

The present invention is directed to an improved high field superconducting solenoid employing a winding of superconducting material and to methods of producing such a solenoid.

It is an object of my invention to provide a high field superconductive solenoid.

It is another object of my invention to provide a high field superconductive solenoid with reproducibility of superconducting properties.

It is a further object of my invention to provide a high field superconductive soleniod which is compact and with no great mechanical stress.

It is a further object of my invention to provide a method of producing a high field superconductive solenoid.

In carrying out my invention in one form, a high field superconductive solenoid comprises a plurality of stacked discs, a layer of electrically insulating material between each of said discs, electrical connections to said discs; each of said discs comprising a coiled superconductive alloy strip, a layer of one of the metals of the strip covering the surface of said strip, and a coiled electrically insulating non-superconductive strip adjacent to the metal layer; and said strips of adjacent discs positioned in opposite directions.

These and various other objects, features, and advantages of the invention will be better understood from the following description taken in connection with the accompanying drawing in which.

Figure 4:
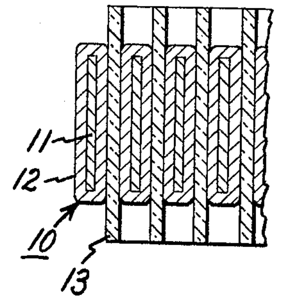
Figures 3, 5, 6, 7:
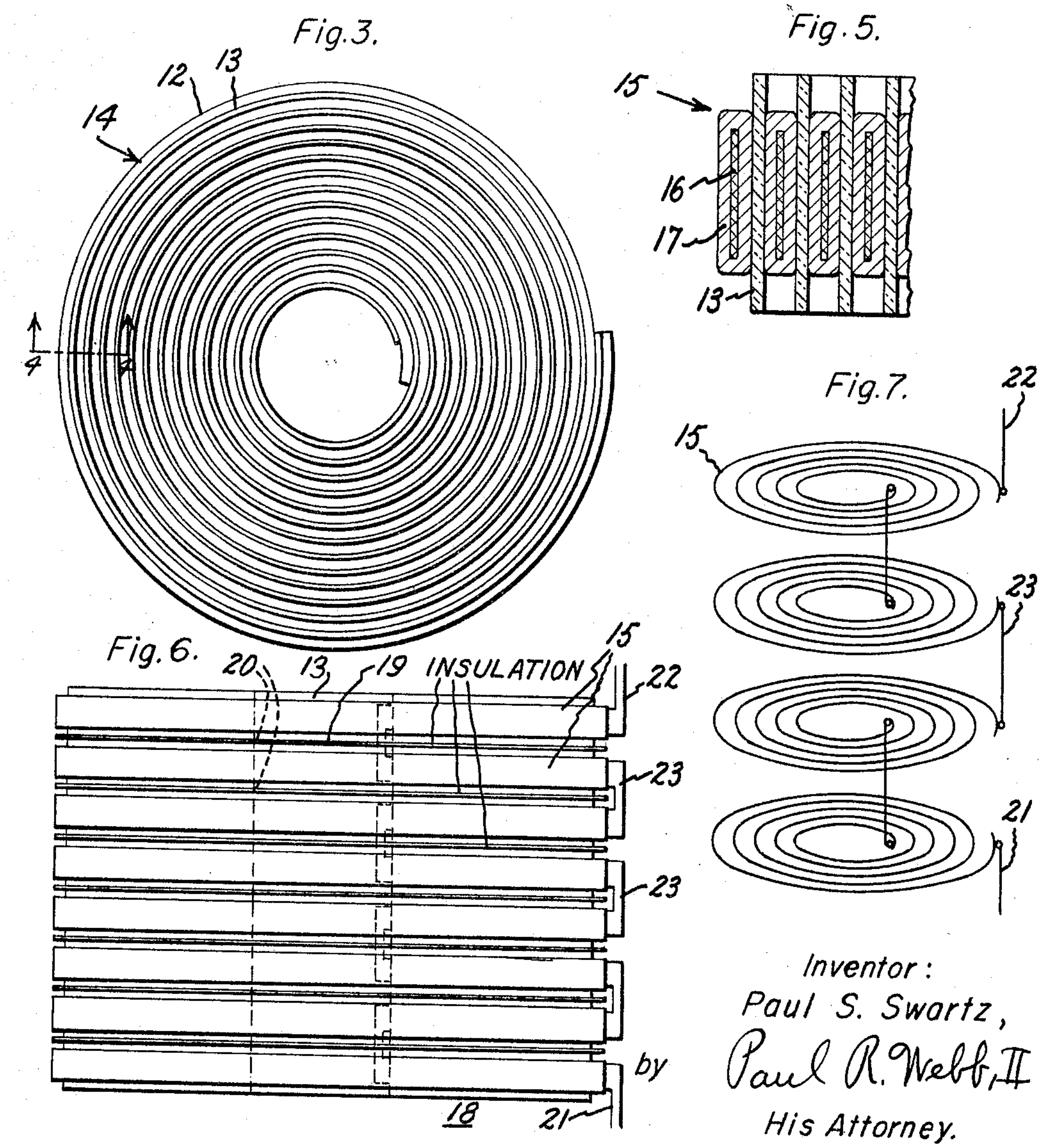
Figures 8, 9, 10, 11, 12, 13, 14, 15, 16:
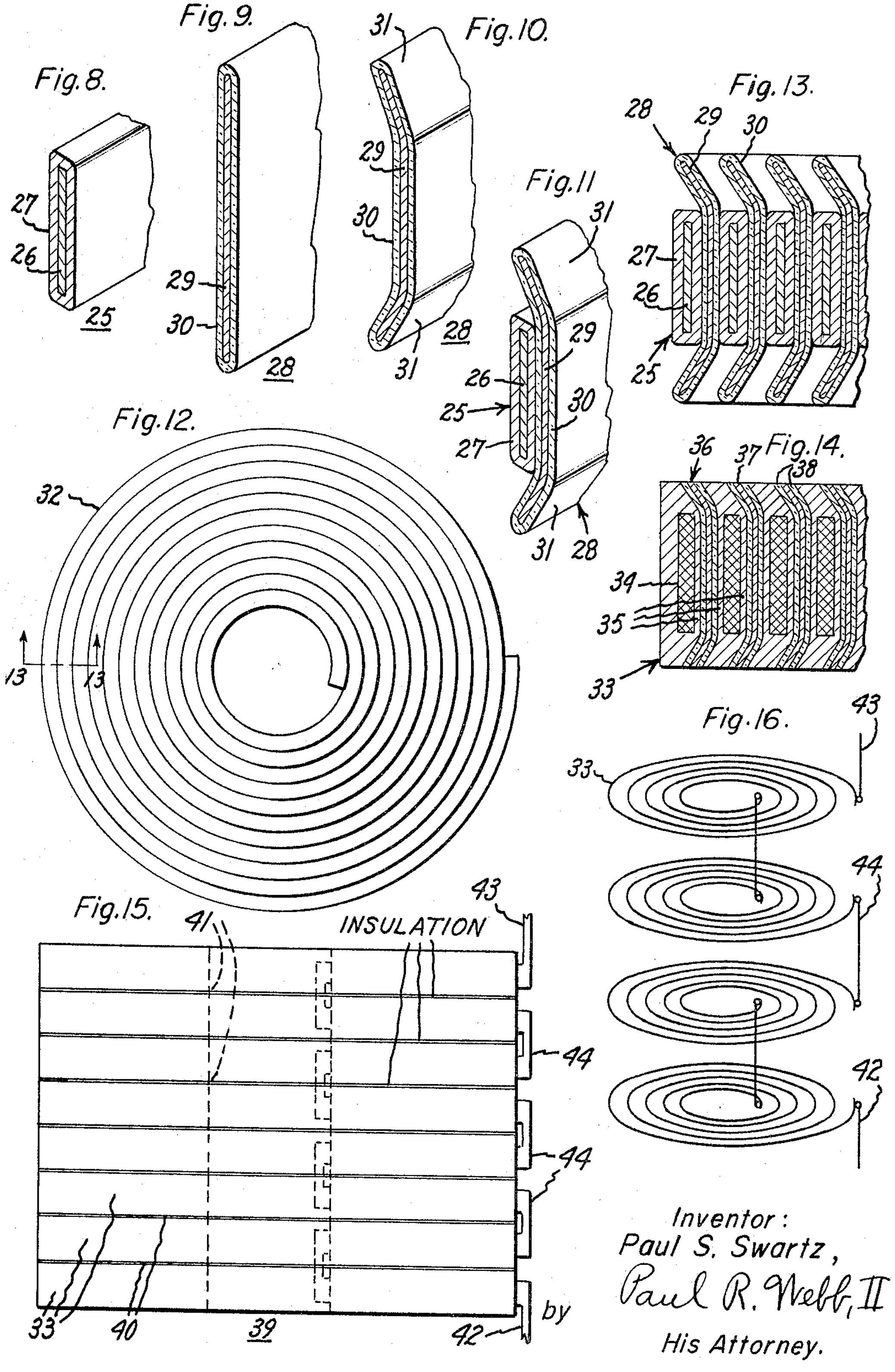

FIGURE 3 discloses a metallic strip and an adjacent insulating strip wound into a helix;

FIGURE 4 is a sectional view of a portion of the helix in FIGURE 3 taken on lines 4—4 thereof;

FIGURE 5 is a sectional view of a portion of the helix in FIGURE 3 similar to FIGURE 4 after the helix has been heat treated;

FIGURE 6 is a side elevational view of a solenoid embodying my invention;

FIGURE 7 is a schematic view of a portion of the solenoid shown in FIGURE 6;

FIGURE 8 is a perspective view of a portion of a superconductive strip;

FIGURE 9 is a perspective view of a portion of a non-superconducting strip;

FIGURE 10 is a perspective view of a portion of the non-superconductive strip shown in FIGURE 9 after it has been crimped;

FIGURE 11 is a perspective view of a portion of a superconducting strip and a non-superconducting strip positioned adjacent one another;

FIGURE 12 discloses a metallic strip and an adjacent insulating strip wound into a helix;

FIGURE 13 is a sectional view of a portion of the helix in FIGURE 12 taken on lines 13—13 thereof;

FIGURE 14 is a sectional view of a portion of the helix in FIGURE 12 similar to FIGURE 13 after the helix has been immersed in a molten metal bath, heat treated therein, and machined to a disc;

FIGURE 15 is a side elevaional view of a solenoid embodying my invention; and

FIGURE 16 is a schematic view of a portion of the solenoid shown in FIGURE 15.

Figure 1:
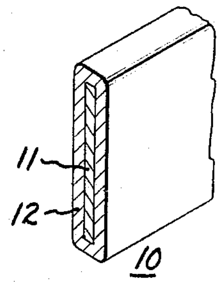
FIGURE 1 is a perspective view of a portion of a superconductive strip.

In FIGURE 1 of the drawing, there is shown a portion of a length of a metallic strip 10 prior to treatment to form a superconductive alloy which comprises a core 11 of one metal such as niobium with a sheath or layer 12 thereon of a second metal such as tin. The sheath or layer 12 is applied to core 11 in any suitable manner such as plating or vapor deposition. While the description of the invention is directed to a solenoid which employs a niobium-tin, $Nb_3Sn$, superconductive strip in its preferred embodiment, other materials may be employed in metallic strip 10 shown in FIGURE 1. For example, strip 10 might comprise a core 11 of vanadium with a gallium layer 12 thereon or a core of niobium 11 with an aluminum layer 12 thereon.

Figure 2:
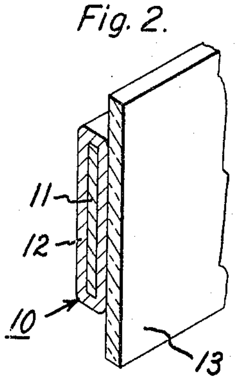
FIGURE 2 is a perspective view of a portion of a superconducting strip and an electrically insulating non-superconducting strip positioned adjacent to one another.

In FIGURE 2, there is shown a portion of metallic strip 10 against which is positioned electrically insulating, non-superconductive strip 13. This strip must be non-superconducting, must be electrically insulating, must have a high melting temperature, and must not react excessively at the treatment temperature of metallic strip 10. For example, the treatment temperature for the niobium and tin strip shown in FIGURES 1 and 2, is at least 850° C. Silicate sheet minerals are suitable for this insulating strip 13. I prefer employing a silicate sheet mineral of phlogopite mica for strip 13. It is also desirable that strip 13 be of a greater width than the width of metallic strip 10, so that during and subsequent to treatment of strip 10 there will be no superconductive or normal electrical shorts between strips 10.

In FIGURE 3 of the drawing, there is shown a helix 14 wound in a counterclockwise direction which comprises a coiled metallic strip 10 and adjacently positioned coiled electrically insulating, non-superconducting strip 13 as shown in previous FIGURE 2 of the drawing. These strips are shown together as a single strip in helical form for purposes of illustration.

In FIGURE 4 of the drawing, there is shown a portion of helix 14 of FIGURE 3 which is taken on line 4—4 of FIGURE 3. Portions of a metallic strip 10 are shown between which are adjacent portions of electrically insulating, non-superconducting strip 13. Helix 14, which is shown in FIGURES 3 and 4, includes a metallic strip 10 having a core 11 of niobium and a layer 12 of tin thereon and an electrically insulating, non-superconducting strip 13 of phlogopite mica positioned adjacent strip 10. The helix is heated in an argon atmosphere at a temperature of 850° C. or more to convert at least a portion of the niobium in core 11 and tin in layer 12 in strip 10 to a superconductive alloy of niobium-tin, $Nb_3Sn$, thereby forming disc 15.

In FIGURE 5 of the drawing, disc 15 is shown which comprises a coiled superconductive alloy strip 16 of niobium-tin, $Nb_3Sn$, a layer of tin 17 covering the surface of strip 15, and electrically insulating non-superconductive strip 13 between adjacent tin layers 17.

In FIGURE 6 of the drawing, there is shown a high field superconductive solenoid 18 which comprises a plurality of stacked discs 15 with a layer 19 of mica electrical insulation between each disc 15. A plurality of discs, a portion of one of which is shown in FIGURE 5, are stacked in this manner. Each layer of insulation 19 has a central aperture 20 which communicates with the central aperture through each disc 15. A current lead or bar 21 is attached, for example, on the outer periphery of the lowermost disc 15. At the uppermost disc 15 there is attached a current lead or bar 22. Adjacent discs in FIGURE 6 have their strips positioned in opposite directions to provide for electrical contact by connections 23 between adjacent discs 15. The positioning of the strips in opposite directions is accomplished, for example, by employing alternate discs 15 wound in a counterclockwise direction as shown in FIGURE 3. The discs between the alternate counterclockwise wound discs are wound in a clockwise direction. If it is desired, the discs are wound in a single direction. Subsequently, alternate discs are positioned in one direction while the discs therebetween are inverted to be positioned in the opposite direction.

In FIGURE 7, there is shown a schematic diagram of four discs 15 as described above in FIGURE 7 wherein the strips of adjacent discs are positioned in opposite directions. The electrical connections 21, 22 and 23 are also shown in the form of lines connecting these discs.

If it is desired, other types of electrical connections are substituted for current leads 21 and 22, and electrical connections 23 in solenoid 18. For example, a double width of superconductive alloy strip of niobium-tin, $Nb_3Sn$, is employed for each current lead and for each electrical connection. The strip is formed from a metallic core of niobium with a layer of tin thereon as shown in FIGURE 1. For example, four spaced-apart strips for electrical connections are formed around an insulated structural tube. A pair of helices 14, which are in opposite directions, are positioned or wound around each of the double width strips. Insulation is provided between the helices.

With the exception of the top and bottom helices, a double width strip is formed around the exterior surface of adjacent helices 14. A double width strip is wound around the exterior surface of both the top and bottom helices forming current leads. The solenoid structure which is thereby formed is then heated in an argon atmosphere at a temperature of 850° C. or more to convert at least a portion of the niobium and tin in both th double width strips and helices to a superconductive alloy of niobium-tin, $Nb_3Sn$. The structural tube is retained or etched out of the structure.

In FIGURE 8 of the drawing, there is shown a portion of a length of a metallic strip 25 prior to treatment to form a superconductive alloy which comprises a core 26 of one metal such as nobium with a sheath or layer 27 thereon of a second metal such as tin. While the description of FIGURES 8–16 of the invention are directed to a solenoid which employs a niobium-tin, $Nb_3Sn$, superconductive strip in its preferred embodiment, other materials may be employed in metallic strip 25 shown in FIGURE 8. For example, strip 25 might comprise a core 26 of vanadium with a gallium layer 27 thereon or a core of niobium 26 with an aluminum layer 27 thereon.

In FIGURE 9, an electrically insulated, non-superconductive strip 28 is shown with a core 29 of a metal of high melting temperature such as tungsten and a thin layer 30 of electrically insulating material such as silica glass. The metal which is employed must have a high-melting temperature in excess of the treatment temperature of metallic strip 25. For example, the temperature must be in excess of 850° C. for the niobium and tin strip shown in FIGURE 8. Secondly, this metal must be non-superconducting. The thin layer of electrically insulating material must also have a similar high melting temperature, be electrically insulating, and not react excessively at the treatment temperature of metallic strip 25. Various types of materials, such as glasses or ceramics, might be employed. For example, the glasses might take the form of silica glass or phosphate glass while the ceramics might include alumina and zirconia. It is also desirable that the insulating, non-superconductive strip be of a greater width than the width of the metallic strip.

In FIGURE 10, electrically insulating, non-superconductive strip 28, which was shown in FIGURE 9, is shown with its ends bent or crimped as at 31. In FIGURE 11, there is shown a portion of metallic strip 25 against which is positioned electrically insulating, non-superconductive strip 28. The crimped ends 31 are bent in the direction towards strip 25. The extra width and crimping of strip 28 is to hold strip 25 in position during processing to a disc for employment in a high field superconductive solenoid.

In FIGURE 12 of the drawing, there is shown a helix 32 which comprises a coiled metallic strip 25 and adjacently positioned electrically insulating, non-superconducting strip 28 as shown in previous FIGURE 11 of the drawing. These strips are shown together as a single strip in helical form for purposes of illustration.

In FIGURE 13 of the drawing, there is shown a portion of helix 32 of FIGURE 12 which is taken on line 13—13 of FIGURE 12. Portions of a metallic strip 25 are shown between which are adjacent portions of electrically insulating, non-superconducting strip 28.

Helix 32, which is shown in FIGURES 12 and 13, includes a metallic strip 25 having a core 26 of niobium and a layer 27 of tin thereon. An electrically insulating, non-superconducting strip 28 having a core 29 of tungsten and a layer 30 of silica glass thereon is positioned adjacent strip 25. The helix is submerged in a bath of molten tin at a temperature of 850° C. or more to convert at least a portion of the niobium in core 26 and tin in layer 27 in strip 25 to a superconductive alloy of niobium-tin, $Nb_3Sn$. The helix is then removed from the bath. A portion of the upper and lower surface of the helix is removed, for example, by machining to form disc 33.

In FIGURE 14 of the drawing, a portion of disc 33 is shown which comprises a coiled superconductive alloy strip 34 of niobium-tin, $Nb_3Sn$, a layer of tin 35 covering the surface of strip 34, an an electrically insulating, non-superconductive strip 36 comprising a core 37 of tungsten and a layer 38 of silica glass electrical insulation. Strips 34 with tin layers 35 thereon are electrically insulated therebetween by strips 36. This is accomplished by the above machining step which removes excess tin and an excess of initial strips 28 from both surfaces of the discs.

In FIGURE 15 of the drawing, there is shown a high field superconductive solenoid 39 which comprises a plurality of stacked discs 33 with a layer 40 of mica electrical insulation between each disc 33. A plurality of discs, a portion of one of which is shown in FIGURE 14, are stacked in this manner. Each layer of insulation 40 has a central aperture 41, which communicates with the central aperture through each disc 33. A current lead or bar 42 is attached, for example, on the outer periphery of the lower most disc 33. At the upper most disc 33 there is attached a current lead or bar 43. Adjacent discs in FIGURE 15 have their strips positioned in opposite directions to provide for electrical contact by connections 44 between adjacent discs 33. This positioning is accomplished in the same manner as described above in FIGURE 3 of the drawing.

In FIGURE 16, there is shown a schematic diagram of four discs 33 as described above in FIGURE 15 wherein the strips of adjacent discs are positioned in opposite directions. The electrical connections 42, 43 and 44 are also shown in the form of lines connecting these discs.

While other modifications of this invention and variations thereof which may be employed within the scope of the invention have not been described, the invention is intended to include such that may be embraced within the following claims.

What I claim as new and desire to secure by Letters Patent of the United States is:

1. A high field superconductive solenoid comprising a plurality of stacked discs, each of said discs having a central aperture therethrough, a layer of electrical insulating material between each of said discs, electrical connections to said discs; each of said discs comprising a coiled superconductive alloy strip, a layer of one of the metals of the strip covering the surface of said strip, and a coiled electrically insulating, non-superconductive strip adjacent to said metal layer; and said strips of adjacent discs positioned in opposite directions.

2. A high field superconductive solenoid comprising a plurality of stacked discs, each of said discs having a central aperture therethrough, a layer of electrical insulation between each of said discs, electrical connections to said discs; each of said discs comprising a coiled $Nb_3Sn$ strip, a layer of tin covering the surface of said strip, and a coiled electrically insulating, non-superconductive strip adjacent said tin layer; and said strips of adjacent discs positioned in opposite directions.

3. A high field superconductive solenoid comprising a plurality of stacked discs, each of said discs having a central aperture therethrough, a layer of mica insulation between each of said discs, electrical connections to said discs; each of said discs comprising a coiled $Nb_3Sn$ strip, a layer of tin covering the surface of said strip, and a coiled electrically insulating, non-superconductive strip of phlogopite mica adjacent said tin layer; and said strips of adjacent discs positioned in opposite directions.

4. A high field superconductive solenoid comprising a plurality of stacked discs, each of said discs having a central aperture therethrough, a layer of electrical insulating material between each of said discs, electrical connections to said discs; each of said discs comprising a coiled superconductive alloy strip, a layer of one of the metals of the strip covering the surface of said strip, and a coiled electrically insulating, non-superconductive strip adjacent to said metal layer, said insulating, non-superconductive strip comprising a core of non-superconductive metal and a layer of electrical insulation thereon; and said strips of adjacent discs positioned in opposite directions.

5. A high field superconductive solenoid comprising a plurality of stacked discs, each of said discs having a central aperture therethrough, a layer of electrical insulation between each of said discs; electrical connections to said discs; each of said discs comprising a coiled $Nb_3Sn$ strip, a layer of tin covering the surface of said strip, and a coiled electrically insulating, non-superconductive strip adjacent said tin layer, said insulating, non-superconductive strip comprising a core of a non-superconductive metal and a layer of electrical insulation thereon; and said strips of adjacent discs positioned in opposite directions.

6. A high field superconductive solenoid comprising a plurality of stacked discs, each of said discs having a central aperture therethrough, a layer of mica insulation between each of said discs, electrical connections to said discs; each of said discs comprising a coiled $Nb_3Sn$ strip, a layer of tin covering the surface of said strip, and a coiled electrically insulating, non-superconductive strip adjacent said tin layer, said insulating, non-superconductive strip comprising a core of non-superconductive tungsten metal and a layer of silica glass insulation thereon; and said strips of adjacent discs positioned in opposite directions.

7. In a high field superconductive solenoid a disc having a central aperture therethrough, said disc comprising a coiled $Nb_3Sn$ strip, a layer of tin covering the surface of said strip, and a coiled electrically insulating, non-superconductive strip adjacent said tin layer.

8. In a high field superconductive solenoid a disc having a central aperture therethrough, said disc comprising a coiled $Nb_3Sn$ strip, a layer of tin covering the surface of said strip, and a coiled electrically insulating, non-superconductive strip of phlogopite mica adjacent said tin layer.

9. In a high field superconductive solenoid a disc having a central aperture therethrough, said disc comprising a coiled superconductive alloy strip, a layer of one of the metals of the strip covering the surface of said strip, and a coiled electrically insulating non-superconductive strip adjacent said metal layer, said insulating, non-superconductive strip comprising a core of non-superconductive metal and a layer of electrical insulation.

10. In a high field superconductive solenoid a disc having a central aperture therethrough, said disc comprising a coiled $Nb_3Sn$ strip, a layer of tin covering the surface of said strip, and a coiled electrically insulating, non-superconductive strip adjacent said tin layer, said insulating non-superconductive strip comprising a core of non-superconductive metal and a layer of electrical insulation.

11. In a high field superconductive solenoid a disc having a central aperture therethrough, said disc comprising a coiled $Nb_3Sn$ strip, a layer of tin covering the surface of said strip, a coiled electrically insulating, non-superconductive strip adjacent said tin layer, said insulating non-superconductive strip comprising a core of non-superconductive tungsten metal and a layer of silica glass insulation.

12. A high field superconductive solenoid comprising a plurality of stacked discs, each of said discs having a central aperture therethrough, a layer of electrical insulating material between each of said discs, electrical connections to said discs; each of said discs comprising a coiled superconductive alloy strip, a layer of one of the metals of the strip covering the surface of said strip, a coiled insulating, non-superconductive strip adjacent to said metal layer, said insulating, non-superconductive strip comprising a core of non-superconductive metal and a layer of electrical insulation thereon, and a coating of one of the metals of said superconductive strip covering said disc; and said strips of adjacent discs positioned in opposite directions.

13. A high field superconductive solenoid comprising a plurality of stacked discs, each of said discs having a central aperture therethrough, a layer of electrical insulation between each of said discs, electrical connections to said discs; each of said discs comprising a coiled $Nb_3Sn$ strip, a layer of tin covering the surface of said strip, a coiled insulating, non-superconductive strip adjacent to said tin layer, said insulating, non-superconductive strip comprising a core of a non-superconductive metal and a layer of electrical insulation thereon, and a coating of tin covering said disc; and said strips of adjacent discs positioned in opposite directions.

14. In a high field superconductive solenoid a disc having a central aperture therethrough, said disc comprising a coiled superconductive alloy strip, a layer of one of the metals of the strip covering the surface of said strip, a coiled insulating, non-superconductive strip adjacent said metal layer, said insulating, non-superconductive strip comprising a core of non-superconductive metal and a layer of electrical insulation, and a coating of one of the metals of said superconductive strip covering said disc.

15. In a high field superconductive solenoid a disc having a central aperture therethrough, said disc comprising a coiled $Nb_3Sn$ strip, a layer of tin covering the surface of said strip, a coiled insulating, non-superconductive strip adjacent said tin layer, said insulating, non-superconductive strip comprising a core of non-superconductive metal and a layer of electrical insulation, and a coating of tin covering said disc.

References Cited by the Examiner

UNITED STATES PATENTS

| | | | |
|---|---|---|---|
| 2,739,371 | 3/1956 | Grisdale et al. | 29—155.57 |
| 2,807,869 | 10/1957 | Rice | 29—155.57 |
| 3,098,181 | 7/1963 | Coiffi | 317—158 |
| 3,102,973 | 9/1963 | Kunzler | 317—158 |
| 3,173,079 | 3/1965 | McFee. | |
| 3,181,936 | 5/1965 | Denny et al. | |

OTHER REFERENCES

Kolm et al.: High Magnetic Fields, The M.I.T. Press and John Wiley & Sons, Inc., New York, 1962, QC 76016, pp. 344–346.

BERNARD A. GILHEANY, *Primary Examiner.*

JOHN F. BURNS, *Examiner.*

G. HARRIS, Jr., *Assistant Examiner.*